United States Patent
Dold et al.

(10) Patent No.: US 11,608,248 B2
(45) Date of Patent: Mar. 21, 2023

(54) SUSPENSION MEMBER ARRANGEMENT FOR AN ELEVATOR AND MONITORING ARRANGEMENT FOR MONITORING A SUSPENSION MEMBER

(71) Applicant: Inventio AG, Hergiswil (CH)

(72) Inventors: Florian Dold, Bremgarten (CH); Oliver Berner, Sursee (CH); Philippe Henneau, Zürich (CH)

(73) Assignee: INVENTIO AG, Hergiswil (CH)

( * ) Notice: Subject to any disclaimer, the term of this patent is extended or adjusted under 35 U.S.C. 154(b) by 778 days.

(21) Appl. No.: 16/476,576

(22) PCT Filed: Jan. 18, 2018

(86) PCT No.: PCT/EP2018/051165
§ 371 (c)(1),
(2) Date: Jul. 9, 2019

(87) PCT Pub. No.: WO2018/141553
PCT Pub. Date: Aug. 9, 2018

(65) Prior Publication Data
US 2019/0352131 A1    Nov. 21, 2019

(30) Foreign Application Priority Data

Jan. 31, 2017   (WO) .................. PCT/EP2017/052064
Apr. 18, 2017   (EP) ..................................... 17166927

(51) Int. Cl.
*B66B 7/12*        (2006.01)
*G01R 31/08*       (2020.01)
*G01N 27/20*       (2006.01)

(52) U.S. Cl.
CPC .............. *B66B 7/12* (2013.01); *B66B 7/1223* (2013.01); *G01N 27/20* (2013.01); *G01R 31/08* (2013.01); *D07B 2501/2007* (2013.01)

(58) Field of Classification Search
CPC ... B66B 7/1223; B66B 7/1207; B66B 7/1215; B66B 5/0006; B66B 5/0018;
(Continued)

(56) References Cited

U.S. PATENT DOCUMENTS 7,123,030 B2   10/2006   Robar et al.
7,192,185 B2    3/2007   Lustenberger
(Continued)

FOREIGN PATENT DOCUMENTS

CN       1613740 A     5/2005
CN       1926047 A     3/2007
(Continued)

OTHER PUBLICATIONS

Huaming Lei et al. "Health Monitoring for Coated Steel Belts in an Elevator System." Journal of Sensors, vol. 2012, Article ID 750261, 5 pages, doi: 10.1155/2012/750261.

*Primary Examiner* — Feba Pothen
(74) *Attorney, Agent, or Firm* — William J. Clemens; Shumaker, Loop & Kendrick, LLP

(57) ABSTRACT

A suspension member arrangement for an elevator includes a suspension member having a plurality of electrically conductive load-bearing cords commonly embedded in an electrically isolating matrix material, a first connector and a second connector each attached to the suspension member and electrically contacting the cords within the suspension member in a contacted end region thereof. The first connector electrically contacts and electrically interconnects in parallel a first group of the cords being a first plurality of directly neighboring ones of the cords. The second connector electrically contacts and electrically interconnects in parallel a second group of the cords being a second plurality of directly neighboring ones of the cords. The suspension member arrangement facilitates electrically contacting the cords of the suspension member using a simple type of
(Continued)

connector whereby deteriorations in characteristics of the suspension member can be electrically detected with high accuracy.

15 Claims, 4 Drawing Sheets

(58) Field of Classification Search
CPC ... B66B 7/062; B66B 7/12; D07B 2501/2007; D07B 2501/20; D07B 1/145; G01R 31/08; H01R 4/5033; H01R 31/08; H01R 4/2404; G01N 27/20
See application file for complete search history.

(56) References Cited

U.S. PATENT DOCUMENTS

| | | | |
|---|---|---|---|
| 7,410,033 B2 | 8/2008 | Veronesi et al. | |
| 8,011,479 B2 | 9/2011 | Stucky et al. | |
| 8,424,653 B2 | 4/2013 | Stucky et al. | |
| 9,254,985 B2 | 2/2016 | Nolting et al. | |
| 9,975,734 B2 | 5/2018 | Dold et al. | |
| 2005/0063449 A1 | 3/2005 | Lustenberger | |
| 2007/0173104 A1 | 7/2007 | Veronesi et al. | |
| 2008/0190709 A1 | 8/2008 | Hawkes et al. | |
| 2008/0223668 A1 | 9/2008 | Stucky et al. | |
| 2011/0284331 A1 | 11/2011 | Stucky et al. | |
| 2013/0207668 A1 | 8/2013 | Fargo et al. | |
| 2015/0362450 A1* | 12/2015 | Lehtinen | G01N 27/20 187/391 |
| 2016/0002006 A1* | 1/2016 | Sun | G01R 17/00 187/254 |
| 2017/0029249 A1 | 2/2017 | Robibero | |

FOREIGN PATENT DOCUMENTS

| | | |
|---|---|---|
| EP | 1730066 B1 | 12/2006 |
| EP | 1732837 B1 | 12/2006 |
| EP | 3124425 A1 | 1/2017 |
| EP | 3124986 A1 | 1/2017 |
| NO | 2017137282 A1 | 8/2017 |
| NO | 2017137307 A1 | 8/2017 |
| NO | 2017021263 A1 | 9/2017 |
| WO | 2011098847 A1 | 8/2011 |
| WO | 2013135285 A1 | 9/2013 |

* cited by examiner

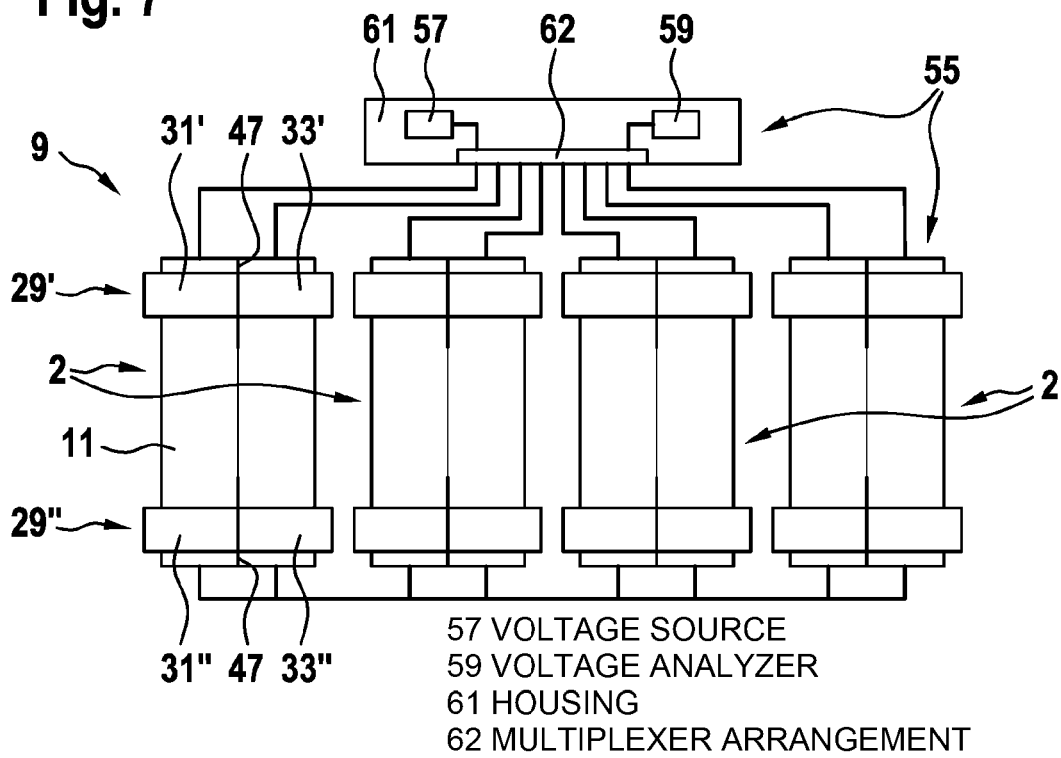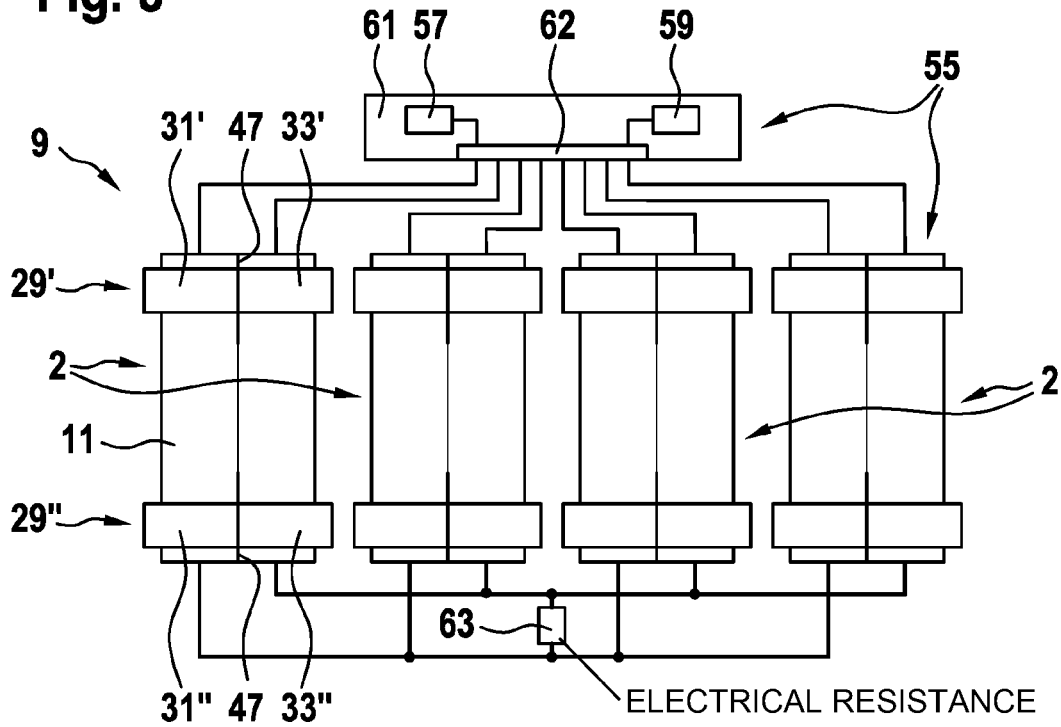

US 11,608,248 B2

SUSPENSION MEMBER ARRANGEMENT FOR AN ELEVATOR AND MONITORING ARRANGEMENT FOR MONITORING A SUSPENSION MEMBER

FIELD

The present invention relates to a suspension member arrangement for an elevator, to a suspension member entity comprising several such suspension member arrangements, to a monitoring arrangement for monitoring a suspension member of an elevator and to an elevator comprising such arrangements.

BACKGROUND

Elevators typically comprise a car and, optionally, a counterweight which may be displaced for example within an elevator shaft or hoistway to different levels in order to transport persons or items for example to various floors within a building. In a common type of elevators, the car and/or the counterweight are supported by a suspension member entity comprising several suspension members arrangements. A suspension member arrangement typically comprises a suspension member, a fixation arrangement for fixing the suspension member within the building and possibly other components which may be used e.g. upon monitoring an integrity of the suspension member. A suspension member may be a member which may carry heavy loads in a tension direction and which may be bent in a direction transverse to the tension direction. For example, a suspension member may be a rope or a belt. Typically, suspension members comprise a plurality of load carrying cords. The cords may be made for example with an electrically conductive material, particularly a metal such as steel. Such cords are typically embedded into an electrically isolating matrix material such as a polymer, the matrix material, inter alia, protecting the cords against e.g. mechanical damaging and/or corrosion.

During operation of the elevator, suspension members have to carry high loads and are typically repeatedly bent when running along for example a traction sheave, a pulley and/or other types of sheaves. Accordingly, substantial physical stress is applied to the suspension members during operation which may lead to deteriorations in the suspension members' physical characteristics such as e.g. their load bearing capability.

However, as elevators may typically be used by people for transportation along significant heights, safety requirements have to be fulfilled. For example, it has to be safeguarded that the suspension member arrangement can always guarantee safe support of the car and/or the counterweight. For such purposes, safety regulations rule for example that substantial deterioration of an initial load bearing capacity of a suspension member arrangement can be detected such that for example counter-measures such as replacing a substantially deteriorated or faulty suspension member from the suspension member entity may be initiated.

For example, various approaches to be used upon monitoring suspension members in an elevator have been described in EP 1 730 066 B1, U.S. Pat. No. 7,123,030 B2, US 2011/0284331 A1, U.S. Pat. No. 8,424,653 B2, US 2008/0223668 A1, U.S. Pat. No. 8,011,479 B2, US 2013/0207668 A1, WO 2011/098847 A1, WO 2013/135285 A1, EP 1 732 837 B1, and in a research article of Huaming Lei et al.: "Health Monitoring for Coated Steel Belts in an Elevator System" in the Journal of Sensors, Volume 2012, Article ID 750261, 5 pages, doi: 10.1155/2012/750261. Most of these prior art approaches are generally based on measuring electrical resistance characteristics upon applying an electrical direct current (DC).

Further approaches for methods and devices for detecting deteriorations in load bearing suspension members of an elevator have been proposed by the present applicant, these approaches relying on AC voltage measurements. These approaches have been described by the present applicant in PCT/EP2016/067966, EP 16155357.3, EP 16155358.1, PCT/EP2017/052064 and PCT/EP2017/052281. Furthermore, the applicant of the present application has filed a U.S. provisional application 62/199,375 and a U.S. non-provisional application Ser. No. 14/814,558 which relate to a more generalized approach for determining deteriorations in a suspension member arrangement for an elevator. All these documents are herein later on referred to as "the applicant's prior art". It shall be emphasized that many technical details of the "applicant's prior art" may also be applied to the present invention and that some technical characteristics of the present invention may be better understood upon studying "the applicant's prior art". Accordingly, the content of the "applicant's prior art" shall be incorporated herein by reference.

In the approaches used for monitoring a deterioration state in suspension members, particularly in those approaches described in the applicant's prior art, electrical AC voltages have to be applied to various cords within the suspension members. For such purpose, connectors are generally attached to a suspension member and electrically contact the cords embedded therein.

There may be a need for an alternative suspension member arrangement comprising connectors for beneficially contacting the cords in a suspension member. Particularly, there may be a need for a suspension member arrangement in which connectors may contact the cords comprised in the suspension member in such a way that each cord may be reliably electrically contacted and/or the cords in a suspension member may be contacted in a manner such that electrical voltages applied through such connectors may be beneficially analyzed. Furthermore, there may be a need for a suspension member entity comprising a plurality of such suspension member arrangements. Additionally, there may be a need for a monitoring device for monitoring one or more suspension members, the monitoring device comprising connectors which allow simple, reliable and/or cost effective contacting of cords in the suspension member.

SUMMARY

Such needs may be met with the subject-matter of the beneficial embodiments defined in the following specification.

According to a first aspect of the invention, a suspension member arrangement for an elevator is proposed. The suspension member arrangement comprises a suspension member including a plurality of electrically conductive load-bearing cords commonly embedded in an electrically isolating matrix material and a first connector and a second connector attached to the suspension member and electrically contacting cords within the suspension member in a contacted end region thereof. Therein, the first connector electrically contacts and electrically interconnects in parallel a first group of cords comprising a first plurality of directly neighboring cords and the second connector electrically contacts and electrically interconnects in parallel a second group of cords comprising a second plurality of directly neighboring cords.

According to a second aspect of the invention, a suspension member entity is described to comprise a plurality of suspension member arrangements according to an embodiment of the first aspect of the invention. Therein, connectors of different suspension member arrangements are electrically connected with each other.

According to a third aspect of the invention, a monitoring arrangement for monitoring a suspension member of an elevator is proposed. Therein, the monitoring arrangement comprises a first connector and a second connector, a voltage source and a voltage analyzer. Each of the connectors comprises a plurality of pins being electrically connected with each other. The pins of one of the connectors are configured for penetrating a matrix material of the suspension member and for electrically contacting a group of cords comprising a plurality of directly neighboring cords comprised in the suspension member. The voltage source is configured for applying alternating voltages to the first and second connectors, respectively. The voltage analyzer is configured for analyzing a superposition voltage resulting upon applying the first and second alternating voltages to the first and second connectors, respectively, after transmission of the voltages through the cords contacted by the first and second connectors.

According to a fourth aspect of the invention, an elevator comprising a suspension members arrangement according to an embodiment of the first aspect of the invention, a suspension member entity according to an embodiment of the second aspect of the invention or a monitoring arrangement according to an embodiment of the third aspect of the invention is proposed.

Ideas underlying embodiments of the present invention may be interpreted as being based, inter alia, on the following observations and recognitions.

As indicated in the introductory portion, various approaches have been developed for monitoring an integrity and/or a deterioration status of suspension members of an elevator wherein the cords comprised in the suspension members have to be electrically contacted via connectors. In these conventional approaches, the plurality of cords comprised in a suspension member is typically electrically contacted such that either all of the cords comprised in a suspension member are electrically interconnected in series or at least some of the cords comprised in a suspension member are electrically interconnected in series.

For example, as described in U.S. Pat. No. 7,410,033 B2, a connector to be arranged at one of the ends of a suspension member is provided with pins. Therein, the pins are interconnected with each other such that pairs of neighboring cords are connected by two pins connected in series. At an opposing end of the suspension member, a first cord in a first pair of cords is interconnected in series with a second cord in a neighboring pair of cords. With such arrangement, all of the cords comprised in the suspension member are interconnected in a long series interconnection using respective connectors attached to the opposing ends of the suspension member.

As an alternative, as for example described in the above-mentioned "Applicant's prior art", two sets of series connections of every second cords comprised in the suspension member may be electrically interconnected. For example, in a specific approach, all even numbered cords are alternately interconnected at their respective ends such as to form a series connection of the even numbered cords. Similarly, all odd number cords may be interconnected in series. Such series interconnections may be made such that for example the odd numbered cords form a series connection in which an electric voltage may be applied to a first end of a first cord and is then transmitted through all following odd numbered cords until reaching a final end of a $(2n+1)^{th}$ cord (with "n" being the number of pairs of cords comprised in the suspension member). Similarly, a second electric voltage may be applied to a first end of a second cord and may then be transmitted through all following even numbered cords until reaching the $(2(n+1))^{th}$ cord.

With such conventional approaches in which cords of a suspension member are interconnected in series, for example an interruption in at least one of the cords may be easily detected as such interruption may interrupt the entire series connection of cords and may therefore be easily detected upon applying a voltage to one end of the series connection and detecting a resulting voltage at an opposite end of the series connection. Furthermore, shunts or short-circuits between neighboring cords may be detected as they, for example, alter a series resistance throughout the series connection of the cords.

However, such conventional approaches of interconnecting the cords of a suspension member using a connector may require that the contact pins of the connector precisely contact each and every cord embedded in the suspension member. When for example only one cord is not correctly electrically contacted, the entire series connection is interrupted and no meaningful measurements may be performed upon applying an electrical voltage to the connector. However, in order to correctly contact each of the cords in a suspension member, the locations of the pins in the connector have to precisely correspond to the locations of the cords within the suspension member. Unfortunately, due to manufacturing tolerances, locations of cords within the suspension member may vary by typically about 0.5 mm or even more in the lateral direction of the suspension member, therefore making it difficult to reliably bring into contact each of the pins with an associated one of the cords in the suspension member.

Furthermore, in such approach in which a plurality of cords is connected in series, it may not or at least hardly be differentiated whether a single cord is interrupted or whether a plurality of cords comprised in the series connection is interrupted. However, in some cases, for example breakage of a single cord may still be acceptable whereas breakage of a plural number of cords exceeding for example a predefined limit number may not be acceptable any more. However, in the above-mentioned conventional approaches, the entire series connection of cords is interrupted independently of whether only one cord is broken or whether a plurality of cords is broken.

In contrast to the conventional approaches with series connections of cords comprised in the suspension member, the suspension member arrangement proposed herein comprises a first and a second connector which each are adapted to electrically contact and electrically interconnect in parallel one group of cords. Therein, the first connector shall interconnect in parallel a first group of cords comprising a first plurality of directly neighboring cords in the suspension member whereas the second connector electrically interconnects in parallel a second group of cords comprising a second plurality of directly neighboring cords. In other words, each of the first and second groups of directly neighboring cords is contacted by an associated one of the first and second connectors. The first and second connectors may be both attached to the suspension member at one of its opposing end regions, i.e. both connectors are attached to the suspension member at its proximal end or both connectors are attached to the suspension member at its opposing distal end. Accordingly, for example a first alternating voltage may be applied via the first connector to each of the cords comprised in the first plurality of cords whereas a second alternating voltage may be applied via the second connector to each of the cords comprised in the second group of cords.

It may be noted that the suspension member arrangement may comprise more than two connectors. In such cases, each of the connectors may contact a group of directly neighboring cords and interconnect them in parallel. However, for example for the sake of simplicity and cost reduction, it may be beneficial to provide only two connectors at one end of the suspension member and thereby contact two groups of directly neighboring cords comprised in this suspension member.

According to an embodiment, each of the first and second connectors may comprise a plurality of pins which, upon being attached to the suspension member, penetrate the matrix material of the suspension member and contact the cords of an associated one of the first and second group of cords of the suspension member. Therein, the pins in one of the first and second connectors are electrically connected with each other, i.e. are electrically connected in parallel in a short-circuited manner.

In other words, each connector may have several pins extending therefrom. The pins may extend in similar or same directions, e.g. parallel to each other. The pins may be long enough such that, when the connector is attached to a suspension member, each of the pins is pressed through the matrix material until it reaches one of the cords embedded therein. The pins may be made with an electrically conductive material and may be interconnected with each other. For example, the pins may be metal pins and/or may be attached to a common electrically conductive base body.

With the approach described herein, electrically contacting the cords within the suspension member may be more reliable and less susceptible for example to misalignment of a connector with respect to the suspension member and its cords.

For example, in the above-mentioned prior art approaches, a single connector had to be attached to the suspension member in precise local alignment of its contact pins with the locations of the cords in the suspension member. Such alignment had to be reliable as, in the intended series connection, a single misalignment resulting in lacking electrical contact between a cord and an associated contact pin resulted in an interruption of the entire series connection of cords. Furthermore, each cord in the suspension member should have been electrically contacted by only one pin of the connector in order to avoid any short-circuits in the intended series connection to be established with the connector.

In contrast hereto, as each of the first and second connectors of the suspension member arrangement proposed herein shall contact each of a plurality of directly neighboring cords of the first and second group of cords, respectively, and shall electrically interconnect these cords in parallel, any misalignment of pins of the connector with the cords in the suspension member does not result necessarily in severe consequences.

Particularly, there may be no strict necessity of a precise alignment of each of a plurality of pins in the connector to an associated one of the cords in the suspension member. Instead, it may be sufficient that each of the cords in the suspension member is mechanically contacted by at least one portion, i.e. at least for example one pin, of the first or second connector, respectively. As all directly neighboring cords in the first or second group of cords shall be interconnected in parallel, it does not matter which of the pins of a connector actually contacts which one of the cords of the first or second group of cords.

Furthermore, with the approach presented herein, a plurality of cords comprised in the first or second group of cords, respectively, is contacted and interconnected in parallel by an associated one of the first and second connectors. Accordingly, even in cases where one or more of the cords in a suspension member are interrupted, an electric voltage applied to one of the connectors will be transmitted through the non-interrupted cords contacted by this connector towards an opposite end region of the suspension member such that it may be measured and analyzed there. Accordingly, while a single or a few broken cords within the first or second group of cords may influence a series resistance through the plurality of parallel cords comprised in such group, it may not completely electrically interrupt a connection between the first end region of the cords and an opposing second end region. Thus, a single broken cord may not interrupt an entire electric connection between opposing end regions of the suspension member. Instead, a minor number of broken cords may only influence a series resistance throughout the plurality of parallel cords in the respective group of cords and, in beneficial cases, such increase is electrical resistances may be analyzed and information about the number of interrupted cords may be derived therefrom.

Accordingly, in the conventional approaches described above, a single broken cord may not be distinguished from a plurality of broken cords such that, upon the series connection of cords being interrupted at only a single cord, e.g. operation of the entire elevator is to be stopped for security reasons. In contrast hereto, in the approach described herein, several cords in a group of cords are connected in parallel such that breakage of a single cord or a few cords may increase an overall electric resistance increase throughout the group of cords but may not interrupt an entire electric connection throughout the group of cords. Accordingly, the increase in electric resistance may be measured and may be analyzed, thereby serving for indicating how many cords in the group of cords are broken. Unless such number of broken cords exceed a certain limit, it may be allowable to continue operation of the elevator without jeopardizing its safety.

According to an embodiment, the pins of a connector extend in parallel to each other at lateral distances being substantially equal to lateral distances between directly neighboring cords in the suspension member.

In other words, the distances between neighboring pins in a connector may be approximately aligned with the distances of the cords in the suspension member. Such alignment may include acceptable tolerances, for example the tolerances being smaller than 1 mm, preferably smaller than 0.5 mm or even smaller than 0.2 mm.

Accordingly, each pin of the connector may contact exactly one of the cords comprised in the suspension member. However, in contrast to the conventional approaches described above, each of the pins in the connector does not have to contact a specific associated one of the cords. Instead, for example a connector may have a larger number of pins than the number of cords comprised in the suspension member, i.e. the width of the connector may be larger than the width of the portion of the suspension member contacted thereby. In such configuration, it does not matter which of the sub-pluralities of pins actually contact the cords in the suspension member as each of the pins is connected in parallel to each other.

Accordingly, for example a standard connector having a standard size may be used for various sizes of suspension members to be contacted therewith. For example, various types of suspension members may be used for different appliances in elevators, these types of suspension members differing, inter-alia, in width. With the approach described herein, a single type of connector may be provided for electrically contacting the cords in each of these types of suspension members. Thereby, a number of components to be manufactured, transported, stored and finally installed in an elevator may be reduced. Thereby, complexity of manufacturing processes, logistics, etc. may be reduced and/or costs may be lower.

In an alternative embodiment, the pins of a connector extend in parallel to each other at lateral distances being substantially equal or smaller than half of lateral distances between directly neighboring cords in the suspension member.

In other words, the lateral distances between neighboring pins of a connector may be significantly smaller than the lateral distances between neighboring cords. For example, the number of pins provided at a connector may be double the number of cords in a portion of a suspension member contacted therewith. Accordingly, with such high number of pins being provided, a probability of at least one of these pins mechanically and electrically correctly contacting one of the cords in a suspension member is very high. Particularly, the larger the number of pins and the smaller the lateral distances between neighboring pins, the higher a probability of correctly contacting the cords. Similar as in the preceding embodiment, the width of the connector may be larger than the width of the portion of the suspension member contacted thereby.

According to an embodiment, the pins of a connector have a tapering cross section.

In other words, each pin may have a pointed tip at its protruding end and may be thicker near to its base. Accordingly, the pointed tip may be for example pushed or drilled through the matrix material and into a cord. Therein, the pointed tip may be for example pressed between strands included in such cord. However, for example in cases of some misalignment between the tips of the pins of the connector and the locations of the cords in the suspension member, while the tip of the pin may be arranged at a certain lateral distance to the cord, its tapering sidewalls may nevertheless come into abutment with the surface of the cord, thereby making sufficient electrical contact therewith. Accordingly, providing the connector with tapering pins may increase a probability of correctly electrically contacting the cords when attaching the connector to a suspension member.

Particularly, according to a specific embodiment, the pins may have a maximum cross sectional width being larger than half of a lateral distance between directly neighboring cords in the suspension member.

In other words, the pins may be substantially tapered such that at their maximum cross-sectional width, there is a minor probability that they are pierced through the matrix material between two neighboring cords without mechanically and electrically contacting at least one of these neighboring cords. Optionally, the maximum cross-sectional width may even be similar or larger than the entire distance between directly neighboring cords such that a pin may not be pierced through the matrix material without contacting both of these neighboring cords. With such substantially tapered geometry, even upon maximum misalignment between the tips of the pins and the centers of the cords, reliable electric contact between each of the pins and at least one of the cords may be established.

According to an embodiment, the first and second group of cords are separated from each other in the contacted end region of a suspension member via a slit. The slit extends through the matrix material of the suspension member in its contacted end region. The slit mechanically separates a portion of the contacted end region comprising the first group of cords from a portion of the contacted end region comprising the second group of cords.

In other words, in the end region of the suspension member where the first and second connectors contact the suspension member, the suspension member may not be continuous with its matrix material continuously enclosing all of the embedded cords. Instead, in such end region, a slit or cut may be provided.

Such slit may extend preferably in the longitudinal direction of the suspension member. Particularly, the slit may extend in parallel to the cords. Preferably, the slit extends between two neighboring cords, preferably centrally between these cords.

For example, the suspension member may be formed by a belt having a plurality of longitudinal grooves extending along the longitudinal direction. Therein, each groove may extend between two neighboring cords embedded in the matrix material of the belt. The slit may then extend along one of such grooves, particularly along a central or middle groove of the belt.

Particularly, the slit may extend from an end wall of the suspension member and into the longitudinal direction of the suspension member. For example, upon installing the first and second connectors at one end region of a suspension member, a technician installing these connectors may first prepare a cut in the suspension member along its longitudinal direction in order to separate to portions of the suspension member into a first portion comprising the first group of neighboring cords and a second portion comprising the second group of neighboring cords. The two portions are thereby separated from each other by the intermediate cut or slit. The first connector may then be attached to the first portion and the second connector may be attached to the second portion of the suspension member.

Due to such slit in the contacted end region of the suspension traction member, physical separation between the portion of the contacted end region comprising the first group of cords and the portion of the contacted end region comprising the second group of cords may be established. Particularly, the intermediate slit may locally mechanically, and therefore electrically, separate both portions of the contacted end region.

Accordingly, due to the electrical separation induced by the intermediate slit, any shunts or leakage currents for example between the neighboring first and second connectors attached to the suspension member's end region may be avoided.

Without providing such slit between the portions of the end regions, for example strands of the cords may protrude beyond the end wall of the suspension member as a result of a cutting process and strands from different portions of the contacted end regions may contact each other thereby provoking lateral leakage currents between both portions of the end region.

According to an embodiment, the slit may extend along a length of the suspension member of at least 5 cm, preferably at least 10 cm.

In other words, the length of the slit may be substantial. Preferably, the length of the slit in the contacted end region may be longer than a width of the first and second connectors connecting the portions of the contacted end region. Accordingly, the slit may effectively mechanically and electrically separate the first and second connectors from each other.

According to an embodiment, the first and second connectors may be separated from each other by an intermediate gap.

In other words, there may be a distance between the first and second connectors. Such gap or distance may at least be 1 mm, preferably at least 5 mm or preferably at least 1 cm.

The gap may be induced for example by the slit provided between the portions contacted by the first and second connectors, respectively.

Particularly, the first and second connectors may be separated from each other in a direction orthogonal to a surface of the suspension member. For example, portions of the end portion of the suspension member separated by the intermediate slit may be bent in opposite directions such that the connectors attached to the portions are moved away from each other.

Alternatively or additionally, according to an embodiment, the first and second connectors may be arranged at different positions offset from each other in a longitudinal direction of the suspension member.

In other words, additionally or alternatively to the above-mentioned gap induced by the slit extending in the longitudinal direction of the suspension member, a gap may be established by attaching the first and second connectors at different longitudinal positions in the longitudinal direction of the suspension member. In other words, while the slit may provide for a gap between the connectors in a width direction, arranging the two connectors at different longitudinal positions may provide for a gap in the longitudinal direction.

As a further alternative, the connectors may be attached to the neighboring portions of the contacted end region of the suspension member in a non-linear manner, i.e. for example in different orientations, such that their laterally neighboring sides are offset from each other by a gap.

According to an embodiment, the first and second connectors are electrically short-circuited with each other.

In other words, at least some of the connectors attached to a suspension member may not be electrically isolated from each other but may be electrically short-circuited to each other. In such short-circuited interconnection, there is a negligible electrical resistance between the two connectors.

Particularly, for monitoring suspension members using an electrical monitoring technique such as those described in the "applicant's prior art", it may be necessary to apply two alternating current (AC) voltages to contacted end regions of two groups of cords of a suspension member at a first end thereof. For such purpose, the first and second connectors may be attached to each portion of the contacted end region comprising the respective first and second plurality of directly neighboring cords and the first and second connectors may be isolated from each other. However, at an opposing second end of the suspension member, it may be beneficial to electrically connect the two groups of cords such as to enable voltage measurements at a neutral point of a circuitry established throughout the first and second groups of cords. For such purpose, the connectors attached to the second end of the suspension member may be electrically short-circuited with each other. For example, the two connectors may be electrically connected with each other via a conductive cable.

Alternatively, according to an embodiment, the first and second connectors may be electrically connected to each other via an electrical resistance.

In other words, in contrast to the before mentioned embodiment, the first and second connectors may not be electrically short-circuited but there may be a substantial electrical resistance between both connectors. Such resistance may be large enough such as to provoke a substantial voltage drop along the electrical resistance upon any voltage measurements during a monitoring procedure. For example, such electrical resistance may be larger than 5 Ohm, preferably larger than 15 Ohm. The electrical resistance is especially between 5 Ohm and 25 Ohm. With such interposing of an electrical resistance between the two connectors at one or both of the contacted end regions of the suspension member, a detectability of a short-circuit of the two portions of the suspension member connected in parallel may be improved.

A suspension traction member entity according to the second aspect of the invention comprises a plurality of suspension traction member arrangements according to embodiments of the first aspect of the invention. Therein, first and second connectors attached to different suspension members may be electrically interconnected with each other. For example, connectors attached to a first suspension member may be electrically connected to connectors of a second suspension member and/or of further suspension members. The interconnection may be direct, i.e. the connectors are short-circuited, or the interconnection may be made via an intermediate electric resistance.

Thus, upon monitoring all suspension members in an elevator, voltages may be applied to some of the portions of the suspension members electrically contacted by one connector and resulting voltages at an opposite end of the suspension members may be analyzed via another connector at its opposite end. By electrically interconnecting various connectors of plural suspension members, a mode of applying voltages to some of the suspension members or their portions may be varied throughout a monitoring procedure.

A monitoring arrangement according to the third aspect of the invention comprises at least two connectors as indicated further above. The monitoring arrangement further comprises a voltage source and a voltage analyzer. The voltage source may apply alternating voltages to each of the first and second connectors, respectively. The voltage analyzer may measure and analyze applied voltages. For example, the monitoring arrangement may be used for beneficially monitoring an integrity status of suspension members using a monitoring method as described for example in more detail in the "applicant's prior art".

Particularly, the voltage analyzer may analyze a voltage which occurs upon superposition of alternating voltages applied to the first and second connectors attached to a first end region of a suspension member after these voltages have been transmitted towards an opposite second end region of the suspension member. Accordingly, using such monitoring arrangement, an integrity or deterioration status of one or more suspension members may be monitored after installing the connectors to the respective end regions of the suspension members and applying voltages to the connectors and analyzing resulting voltages at another location of the suspension members. Therein, due to the beneficial implementation of the connectors, as described further above, the monitoring arrangement may be easily applied to the suspension members and may reliably detect any deteriorations or failures within the suspension members.

It shall be noted that possible features and advantages of embodiments of the invention are described herein partly with respect to a suspension member arrangement, partly with respect to a suspension traction member entity comprising such suspension member arrangements and partly with respect to a monitoring arrangement or an elevator comprising at least one of these components. One skilled in the art will recognize that the features may be suitably transferred from one embodiment to another and features may be modified, adapted, combined and/or replaced, etc. in order to come to further embodiments of the invention.

In the following, advantageous embodiments of the invention will be described with reference to the enclosed drawings. However, neither the drawings nor the description shall be interpreted as limiting the invention.

DESCRIPTION OF THE DRAWINGS

FIG. 7 shows a suspension member entity according to an embodiment of the present invention.

FIG. 8 shows a suspension member entity according to another embodiment of the present invention.

The figures are only schematic representations and are not to scale. Same reference signs refer to same or similar features throughout the figures.

DETAILED DESCRIPTION

Figure 1:
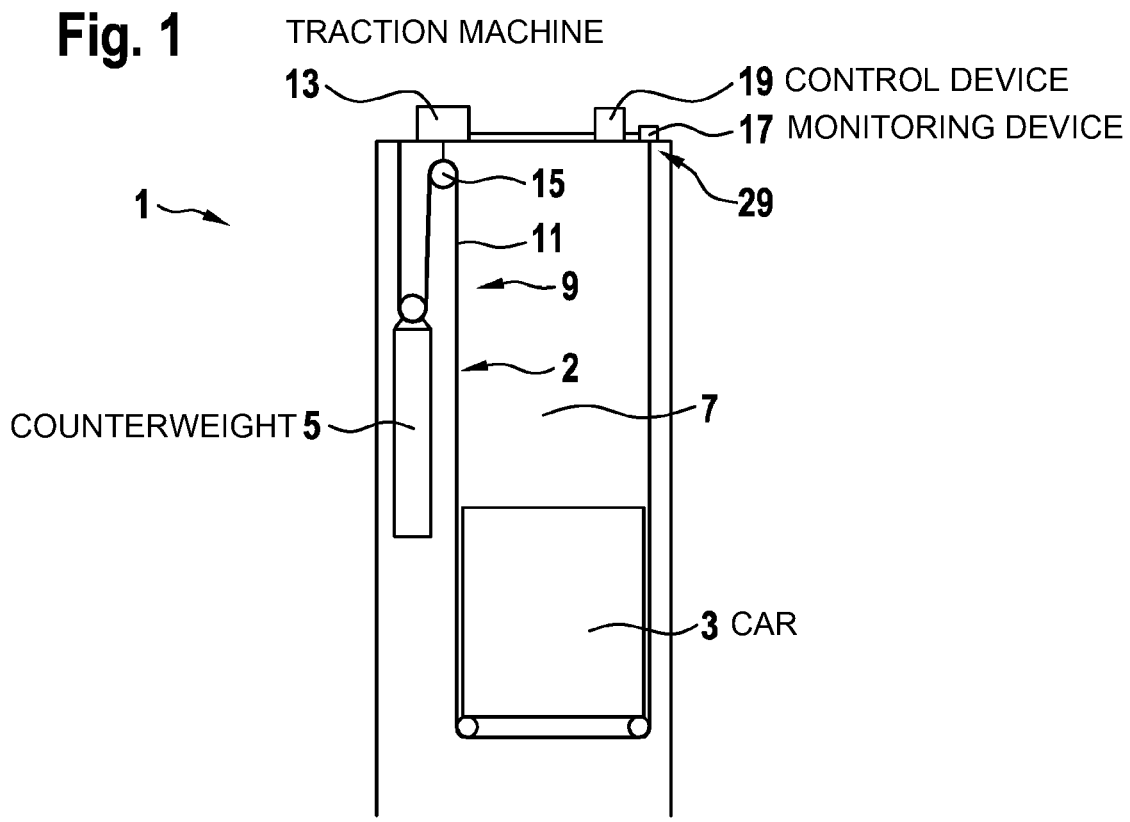
FIG. 1 shows an elevator in which a suspension member arrangement according to an embodiment of the invention may be applied.

FIG. 1 shows an elevator 1 in which a suspension member arrangement according to embodiments of the present invention may be implemented.

The elevator 1 comprises a car 3 and a counterweight 5 which may be displaced vertically within an elevator shaft 7. The car 3 and the counterweight 5 are suspended by a suspension member entity 9. This suspension member entity 9 comprises one or more suspension member arrangements 2. Each suspension member arrangement 2 comprises a suspension member 11, sometimes also referred to as suspension traction media (STM). Such suspension members 11 may be for example ropes, belts, etc. Furthermore, the suspension member arrangements 2 may comprise additional components such as, inter-alia, a monitoring device 17 for monitoring an integrity or deterioration status of the suspension member 11. In the arrangement shown in FIG. 1, end portions of the suspension members 11 are fixed to a supporting structure of the elevator 1 at a top of the elevator shaft 7. The suspension members 11 may be displaced using an elevator traction machine 13 driving a traction sheave 15. An operation of the elevator traction machine 13 may be controlled by a control device 19.

It may be noted that the elevator 1 and particularly its suspension member(s) 11 and its monitoring device 17 for detecting the deterioration status may be configured and arranged in various other ways than those shown in FIG. 1. For example, instead of being fixed to the support structure of the elevator 1, the end portions of the suspension members 11 may be fixed to the car 3 and/or to the counterweight 5.

The suspension members 11 to be driven for example by the traction machine 13 may utilize metal cords or ropes to support a suspended load such as the car 3 and/or the counterweight 5 that is moved by the traction machine 13.

Figure 2:
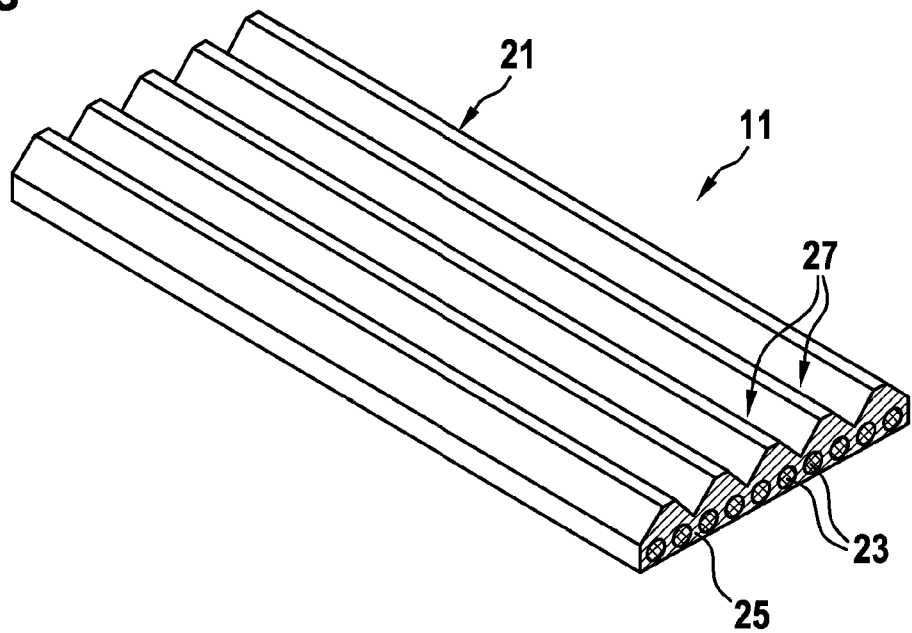
FIG. 2 shows a suspension member for an elevator.

FIG. 2 shows an example of a suspension member 11 which is embodied with a belt 21. The belt 21 comprises a plurality of cords 23 which are arranged parallel to each other and spaced from each other. The cords 23 are enclosed in a matrix material 25 forming, inter alia, a coating. Such coating may mechanically couple neighboring cords 23. Furthermore, the matrix material 25 may protect the cords 23 for example against corrosion and/or abrasion. The coating may have a textured or profiled surface including longitudinal guiding grooves 27. The cords 23 may typically consist of or comprise wires or strands made from a metal such as steel. The matrix material 25 may consist of or comprises a plastic or elastomeric material, for example a polymer. Accordingly, the cords 23 are typically electrically conductive such that an electric voltage may be applied to and/or an electric current may be fed through the cords 23 without significant losses. Furthermore, the cords 23 are preferably electrically isolated from each other via the interposed electrically insulating matrix material 25 such that, as long as an integrity of the coating is not deteriorated, an electrical current or voltage between neighboring cords cannot be transmitted, i.e. no significant shunt current can flow from one cord 23 to another.

Alternatively, suspension members 11 may have other shapes or configurations. For example, a belt may have several cords included into a body formed of matrix material, the body being non-profiled (i.e. flat) or having other shapes as those shown in FIG. 2. Generally, the suspension members 11 may be provided as coated steel suspension members.

As the integrity of the suspension member 11 is mandatory for the safety of the elevator 1, such integrity has to be continuously or repeatedly monitored in order to reliably detect any deterioration therein. For such purpose, the monitoring device 17 may apply electric voltages to the cords 23 and may analyze resulting voltages occurring at another position along the length of the suspension member 11. Details on how to apply and analyze such electric voltages are disclosed in the "applicant's prior art".

In order to enable applying electric voltages to the cords 23 embedded in the matrix material 25, connectors have to be attached to the suspension member 11. Such connectors, on the one hand, should be configured for reliable mechanical attachment on the suspension member 11. On the other hand, such connectors shall provide for an electrical connection with the embedded cords 23. The combination of a suspension member 11 with connectors shall be referred to herein as suspension member arrangement 2.

Figure 3:
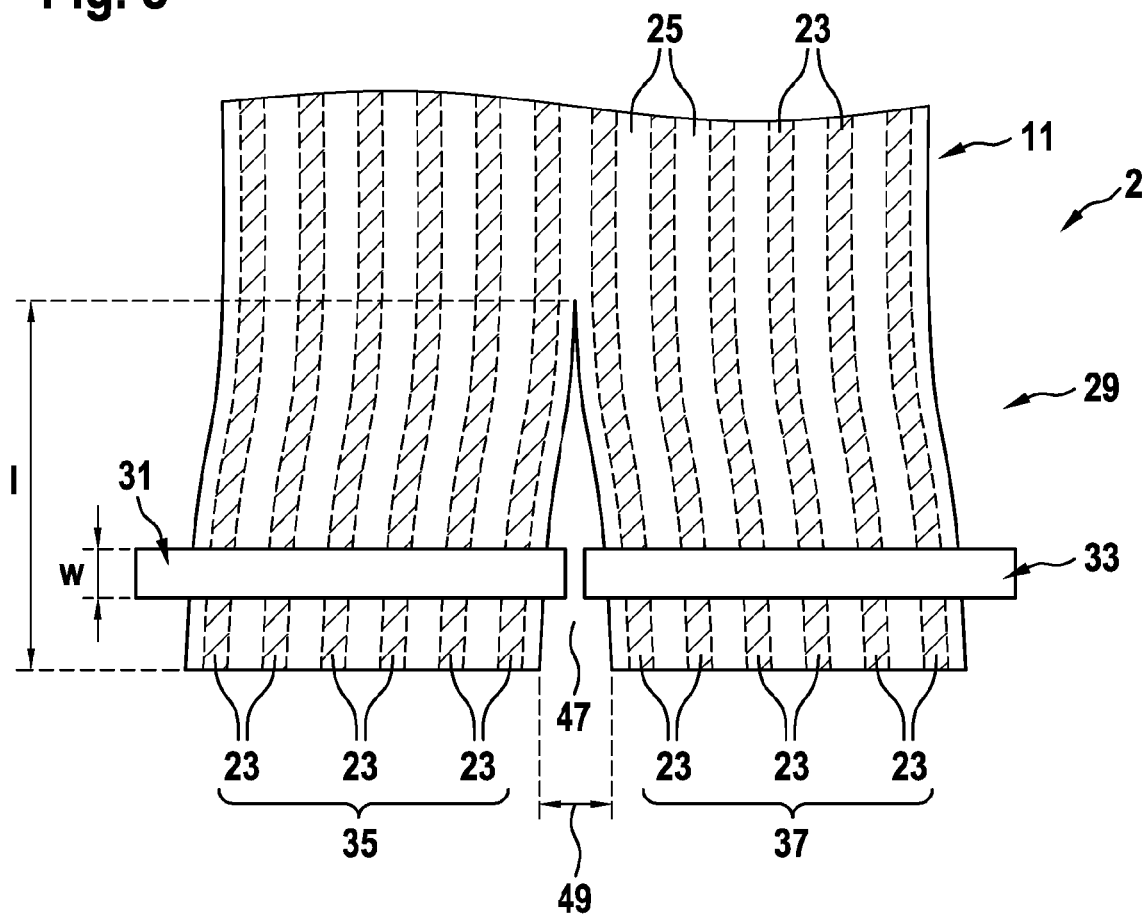
FIG. 3 shows a partial top view onto a suspension member according to an embodiment of the invention.
Figure 4:
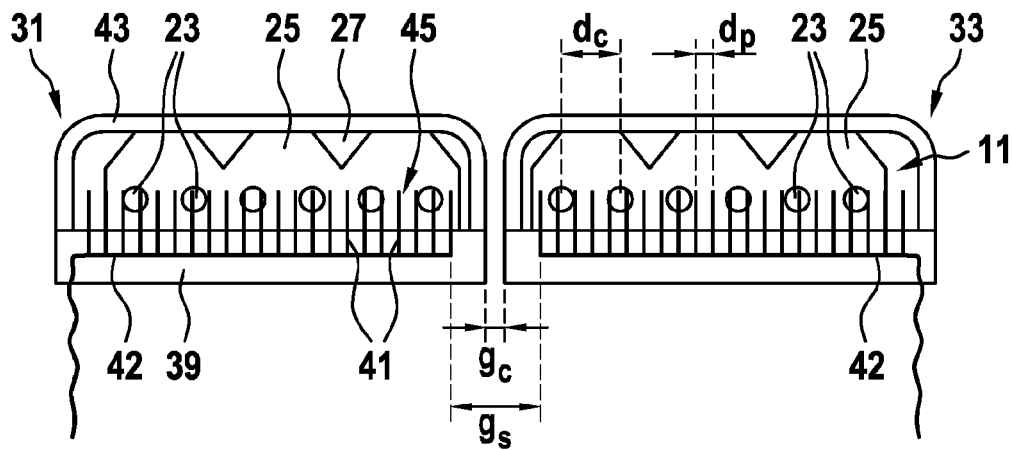
FIG. 4 shows a cross-sectional view through a suspension member according to an embodiment of the invention.

FIGS. 3 and 4 show a top view and a cross-sectional view onto a contacted end portion 29 of such suspension member arrangement 2. In FIG. 3, the cords 23 embedded in the matrix material 25 are visualized in phantom hatchings.

The suspension member arrangement 2 comprises a first connector 31 and a second connector 33. Both connectors 31, 33 are attached to the suspension member 11 and electrically contact the cords 23 within the suspension member 11 in the contacted end region 29. Therein, the first connector 31 electrically contacts and electrically interconnects in parallel a first group 35 of cords 23. This first group 35 comprises cords 23 directly neighboring each other in a left-side half of the suspension member 11. The second connector 33 electrically contacts and electrically interconnects in parallel a second group 37 of cords 23 comprising directly neighboring cords in a right-side half of the suspension member 11.

As shown in FIG. 4, each of the connectors 31, 33 comprises a base body 39 from which a plurality of pins 41 extend. The connectors 31, 33 furthermore comprises a clamp part 43.

Upon installing a connector 31, 33 to an end portion 29 of the suspension member 11, the base body 39 with its protruding pins 41 may be pressed into the matrix material 25 of the suspension member 11. The pins 41 may have a pointed tip 45 such that they can be relatively easily pierced into the matrix material 25. Furthermore, the pins 41 may have a sufficient length such as to penetrate into a depth of the suspension member 11 where the cords 23 extend. Accordingly, the pins 41 may pierce into or may laterally abut to the cords 23.

As the pins are made with a highly electrically conductive material such as a metal and as furthermore also the base body 39 from which the pins 41 extend is made with a highly electrically conductive material such as metal or comprises a parallel interconnector part 42 made from such electrically conductive material, the pins 41 are electrically connected in parallel. Accordingly, the cords 23 contacted by one of the first and second connectors 31, 33, i.e. all cords 23 of one of the first and second groups of cords 35, 37, are electrically interconnected in parallel by the respective connector 31, 33.

Upon having installed the base body 39 with its protruding pins 41 penetrating the matrix material 25, the clamp part 43 may be mechanically connected with the base body 39 such as to clamp the suspension member 11 in between both parts, thereby establishing a mechanically stable cooperation of the connector 31, 33 with the connected end portion 29 of the suspension member 11.

In principle, a lateral distance between neighboring pins 41 may be established such as to correspond to a lateral distance between neighboring cords 23 such that each pin 41 may contact one of the cords 23. However, in such case, precise alignment of the connectors 31, 33 with their pins 41 being aligned with the cords 23 is necessary for establishing a reliable electric connection to each of the cords 23.

Therefore, as shown in FIG. 4, it may be preferable to provide the connectors 31, 33 with a larger number of pins 41 than the number of cords 23 to be contacted. Particularly, a lateral distance $d_p$ between neighboring pins 41 may be for example equal or smaller than half of the distance $d_c$ between neighboring cords 23. In other words, a number of pins 41 may be double or more than a number of cords 23 to be contacted by the connector 31, 33. In such configuration with very narrowly spaced pins 41, there is a very high probability that at least one of the pins 41 comes into contact with a cord 23 upon installing the respective connector 31, 33 at the end portion 29 of the suspension member 11.

Furthermore, as shown in FIG. 4, the connectors 31, 33 may be broader than the portions of the suspension member 11 to be contacted thereby and may have more pins 41 than necessary. Accordingly, connectors 31, 33 having a standard size may be used for electrically connecting both smaller suspension members 11 as well as wider suspension members 11. Thereby, a number of components to be produced, stored, transported and finally installed may be minimized.

While each of the first and second connectors 31, 33 shall connect all cords 23 comprised in the first and second groups 35, 37 of cords, respectively, there may be at least some configurations in which any electric contact between the first and second connectors 31, 33 should be avoided.

While, in principle, the two connectors could be attached to the suspension member 11 side-by-side in its end portion 29, there may remain a risk that, in such configuration, lateral currents may occur between the first group 35 of cords 23 and the second group 37 of cords 23. Particularly, for example upon cutting the suspension member 11 at its end, some of the strands in a cord 23 may not be correctly cut-off such that they may protrude from the end wall of the cut suspension member 11 and may then come into contact with protruding strands of neighboring cords 23. Such situation may result in leakage currents between the first and second groups 35, 37 of cords 23.

In order to avoid such effect, a slit 47 or cut may be provided at the end portion 29 contacted by the two connectors 31, 33. Such slit 47 may extend in parallel to the cords 23. For example, the slit 47 may divide the end portion 29 of the suspension member 11 into two halves, each comprising one of the first and second groups 35, 37 of cords 23.

For example, such slit 47 may be made by a technician before installing the first and second connectors 31, 33 by longitudinally cutting the end portion 29 of the suspension member 11. For example, the slit 47 may have a length l being longer than a width w of the connectors 31, 33. The length l of the slit 47 may be for example longer than 5 cm.

Furthermore, the slit 47 may form a transversal gap 49 between both portions or halves of the suspension member 11 including the first and second groups 35, 37 of cords 23, respectively. Such transversal gap 49 may have a width $g_s$ of for example a few millimeters. Furthermore, also the first and second connectors 31, 33 may be separated from each other by a transversal gap having a width $g_c$ of a few millimeters.

Alternatively or additionally, the end portions 29 of the suspension member 11 including the first and second groups 35, 37 of cords may be bent in opposite directions orthogonal to the surface of the suspension member 11, i.e. one portion 29 may be bent upwards and the other portion 29 may be bent downwards. Accordingly, the first and second connectors 31, 33 attached to these portions 29 are moved away from each other, thereby establishing a gap between both connectors 31, 33.

Accordingly, due to the slit 47, a reliable electric isolation between the first group 35 of cords 23 contacted by the first connector 31 and the second group 37 of cords 23 contacted by the second connector 33 may be established.

Figure 5:
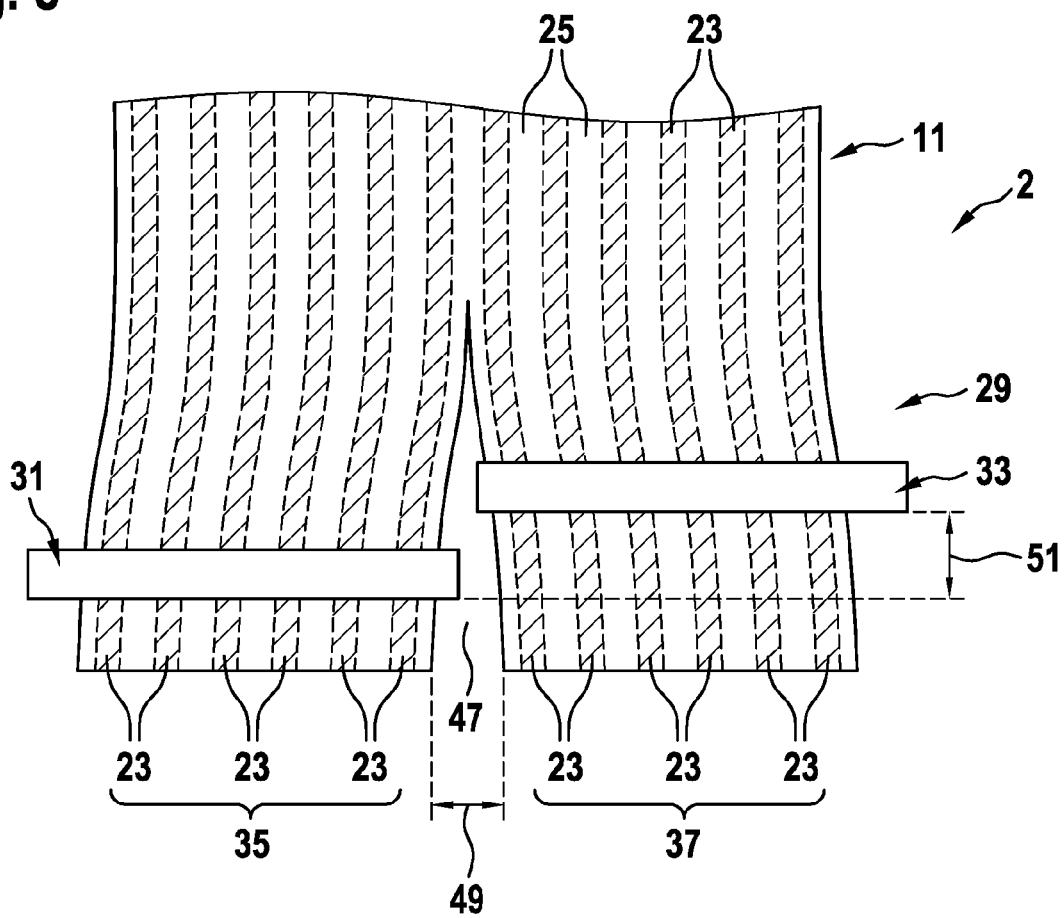
FIG. 5 shows a partial top view onto a suspension member according to another embodiment of the invention.

Another or additional option for avoiding leakage currents between the first and second groups 35, 37 of cords 23 is shown in FIG. 5. Therein, the portions of the suspension member 11 comprising the first and second groups 35, 37 of cords 23, respectively, are again separated from each other via an intermediate transversal gap 49 generated by a slit 47. In order to further separate the first and second connectors 31, 33 from each other, the first and second connectors 31, 33 are offset with respect to each other in a longitudinal direction of the suspension member 11. Thereby, a longitudinal gap 51 extending in the longitudinal direction of the suspension member 11 is generated between neighboring ends of the first and second connectors 31, 33. The longitudinal gap 51 may have a width of for example a few millimeters to a few centimeters.

Figure 6:
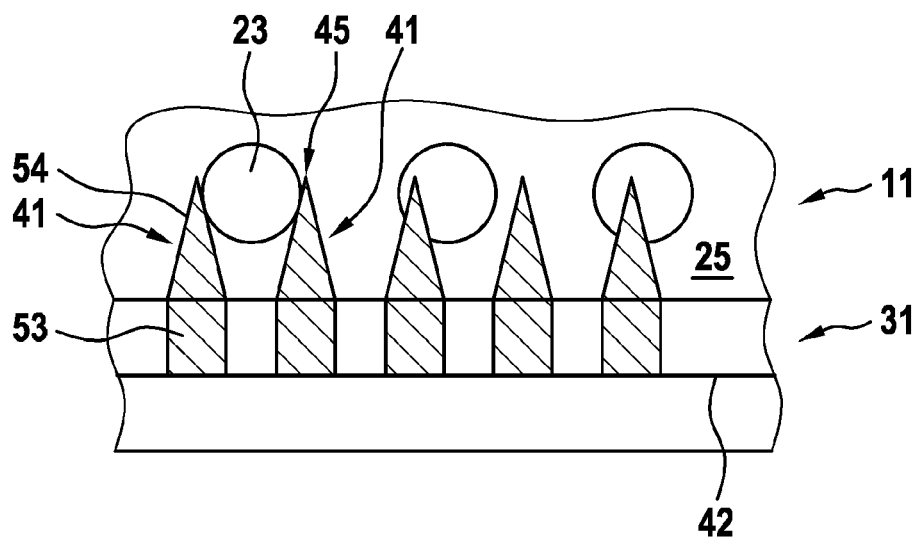
FIG. 6 shows a cross-sectional partial view onto pins of a connector piercing into a suspension member of a suspension member according to another embodiment of the invention.

FIG. 6 shows a partial cross-sectional view through a suspension member 11 connected by a connector 31. Therein, the pins 41 have a tapering cross section with a pointed tip 45 at their distal end and a broad basis 53. Having such tapered shape, the pins 41 may be easily pierced into the matrix material 25 of the suspension member 11. However, even when the pins 41 are not precisely aligned with the cords 23, i.e. when the tip 45 of a pin 41 would not be pierced into a cord 23, there is a high probability that at least a lateral surface 54 of the pin 41 comes into abutment with the cord 23, thereby establishing an electric contact.

FIG. 7 and FIG. 8 shows two embodiments of suspension member entities 9 comprising a plurality of suspension member arrangement 2. Therein, a monitoring arrangement 55 is provided for monitoring an integrity or deterioration status of the suspension members 11. The monitoring arrangement 55 comprises a voltage source 57 and a voltage analyzer 59. The voltage source 57 may generate alternating (AC) voltages. The voltage analyzer 59 may analyze an applied voltage with respect to its alternating current (AC) component and/or its direct current (DC) component. Both, the voltage source 57 and the voltage analyzer 59 may be comprised in a common housing 61 forming for example the monitoring device 17 (see FIG. 1). The voltage source 57 and the voltage analyzer 59 may be electrically connected to various connectors 31, 33, wherein a connection configurations may be altered using a multiplexer arrangement 62.

On each of multiple suspension members 11, a first connector 31' and a second connector 33' are attached to a proximal end portion 29' in a side-by-side arrangement. Similarly, on the opposite distal end portion 29" of the suspension members 11, two connectors 31", 33" are attached. The proximal and distal end portions 29', 29" are separated into halves by respective slits 47 (only schematically shown).

Accordingly, in an exemplary configuration established by the multiplexer arrangement 62, two AC voltages being phase shifted with respect to each other by 180° may be applied to different groups 35, 37 of cords 23 in a first suspension member 11. Therein, a first AC voltage may be applied to the first connector 31' at the proximal end portion 29' and a second AC voltage may be applied to the second connector 33' at the proximal end portion 29'. Each of the first and second connectors 31', 33' may then apply the respective AC to each of the plurality of cords 23 comprised in the group 35, 37 of cords 23 contacted by the associated connector 31', 33'. At the opposite distal end section 29" of the suspension member 11, first and second connectors 31", 33" may again contact these cords 23. These connectors 31", 33" at the distal end portions 29" may be connected to other suspension members 11 which may then be used to transmit a superposition voltage present at these distal end portions 29" back towards the voltage analyzer 59 of the monitoring arrangement 55. Further details of such possible measurement arrangement and method may be obtained from the "applicant's prior art".

In the configuration shown in FIG. 7, the connectors 31", 33" at the distal end portion 29" are directly electrically connected to each other, i.e. are electrically short-circuited with each other.

In the alternative configuration shown in FIG. 8, the connectors 31", 33" at the distal end portions 29" are connected to each other via an electrical resistance 63. Such circuitry including one or more electrical resistances 63 at one or both of end portions 29 of a suspension member 11 may be used to increase detectability of short-circuits between both halves of the suspension member 11 connected in parallel.

Finally, it should be noted that terms such as "comprising" do not exclude other elements or steps and that terms such as "a" or "an" do not exclude a plurality. Also, elements described in association with different embodiments may be combined.

In accordance with the provisions of the patent statutes, the present invention has been described in what is considered to represent its preferred embodiment. However, it should be noted that the invention can be practiced otherwise than as specifically illustrated and described without departing from its spirit or scope.

LIST OF REFERENCE SIGNS 1 elevator
2 suspension member arrangement
3 car
5 counterweight
7 elevator shaft
9 suspension member entity
11 suspension member
13 traction machine
15 traction sheave
17 monitoring device
19 control device
21 belt
23 cords
25 matrix material
27 grooves
29 end portion (29', 29")
31 first connector (31', 31")
33 second connector (33', 33")
35 first group of cords
37 second group of cords
39 base body
41 pins
42 interconnector apart
43 clamp part
45 pointed tip of pin
47 slit
49 transversal gap
51 longitudinal gap
53 basis of tapered pin
54 lateral surface
55 monitoring arrangement
57 voltage source
59 voltage analyzer
61 housing
62 multiplexer arrangement
63 electrical resistance
$d_c$ lateral distance between cords
$d_p$ lateral distance between pins
$g_c$ width between connectors
$g_s$ width of transversal gap
l length of slit
w width of connectors

The invention claimed is:

1. A suspension member arrangement for an elevator comprising:
   a suspension member including a plurality of electrically conductive load-bearing cords commonly embedded in an electrically isolating matrix material;
   a first connector and a second connector each attached to the suspension member and electrically contacting cords within the suspension member in a contacted end portion of the suspension member;

wherein the first connector electrically contacts and electrically interconnects in parallel a first group of the cords comprising a first plurality of directly neighboring ones of the cords;

wherein the second connector electrically contacts and electrically interconnects in parallel a second group of the cords comprising a second plurality of directly neighboring ones of the cords; and wherein the first group of the cords is separated from the second group of the cords in the contacted end portion by a slit extending through the matrix material in the contacted end portion, the slit mechanically separating a portion of the contacted end portion including the first group of the cords from a portion of the contacted end portion including the second group of the cords and forming a transversal gap between the first connector and the second connector in a width direction of the suspension member.

2. The suspension member arrangement according to claim 1 wherein the slit extends along a length of the suspension member of at least 5 cm.

3. The suspension member arrangement according to claim 1 wherein the first connector and the second connector are separated from each other by a transversal gap.

4. The suspension member arrangement according to claim 1 wherein the first connector and the second connector are arranged at different positions offset from each other in a longitudinal direction of the suspension member.

5. The suspension member arrangement according to claim 1 wherein each of the first connector and the second connector includes a plurality of pins penetrating the matrix material and contacting the cords of the suspension member, the pins in each of the pluralities of pins being electrically interconnected.

6. The suspension member arrangement according to claim 5 wherein directly neighboring ones of the pins extend in parallel to each other at a lateral distance being substantially equal to a lateral distance between directly neighboring ones of the cords in the suspension member.

7. The suspension member arrangement according to claim 5 wherein directly neighboring ones of the pins extend in parallel to each other at a lateral distance being one of substantially equal to and smaller than half of a lateral distance between directly neighboring ones of the cords in the suspension member.

8. The suspension member arrangement according to claim 5 wherein the pins have a tapering cross section.

9. The suspension member arrangement according to claim 8 wherein the pins have a maximum cross sectional width being larger than half of a lateral distance between directly neighboring ones of the cords in the suspension member.

10. The suspension members arrangement according to claim 1 wherein the first connector and the second connector are electrically short-circuited with each other.

11. The suspension members arrangement according to claim 1 wherein the first connector and the second connector are electrically connected to each other by an electrical resistance.

12. A suspension member entity comprising a plurality of the suspension member arrangement according to claim 1 wherein the first connectors and the second connectors of the suspension member arrangements are electrically connected with each other.

13. A monitoring arrangement for monitoring a suspension member of an elevator, the suspension member including a plurality of electrically conductive load-bearing cords commonly embedded in an electrically isolating matrix material, the arrangement comprising:

a first connector and a second connector each including a plurality of pins being electrically interconnected, wherein the pins of each of the first and second connectors are adapted to penetrate the matrix material of the suspension member and to electrically contact a first group and a second group of the cords respectively in a contacted end portion of the suspension member, the first and second groups each comprising a plurality of directly neighboring ones of the cords;

wherein the first group is separated from the second group in the contacted end portion by a slit extending through the matrix material in the contacted end portion, the slit mechanically separating a portion of the contacted end portion including the first group of the cords from a portion of the contacted end portion including the second group of the cords and forming a transversal gap between the first connector and the second connector in a width direction of the suspension member;

a voltage source connected to the first and second connectors for applying alternating voltages to the first and second connectors; and a voltage analyzer connected to the first and second connectors for analyzing a superposition voltage resulting from applying the alternating voltages to the first and second connectors and transmission of the alternating voltages through the cords contacted by the first and second connectors.

14. An elevator comprising:
at least one suspension member including a plurality of electrically conductive load-bearing cords commonly embedded in an electrically isolating matrix material;
at least one of an elevator car and a counterweight connected to the at least one suspension member; and
the monitoring arrangement according to claim 13 connected to the at least one suspension member.

15. A suspension member arrangement for an elevator comprising:
a suspension member extending in a longitudinal direction between opposite end portions and including a plurality of electrically conductive load-bearing cords commonly embedded in an electrically isolating matrix material;
a first connector and a second connector each attached to the suspension member directly at a same one of the end portions and electrically contacting cords within the suspension member in the contacted one of the end portions of the suspension member;
wherein the first connector electrically contacts and electrically interconnects in parallel a first group of the cords comprising a first plurality of directly neighboring ones of the cords;
wherein the second connector electrically contacts and electrically interconnects in parallel a second group of the cords comprising a second plurality of directly neighboring ones of the cords; and
wherein the first connector and the second connector are arranged at different positions offset from each other in the longitudinal direction of the suspension member.

* * * * *